United States Patent [19]

Shimizu et al.

[11] Patent Number: 4,863,835
[45] Date of Patent: Sep. 5, 1989

[54] DEVELOPER COMPOSITION FOR LITHOGRAPHIC PRINTING PLATES

[75] Inventors: Shigeki Shimizu; Akinobu Oshima, both of Tokyo; Hiroshi Ide; Noriaki Takahashi, both of Yokohama, all of Japan

[73] Assignee: Mitsubishi Chemical Industries Limited, Tokyo, Japan

[21] Appl. No.: 439,876

[22] Filed: Nov. 8, 1982

Related U.S. Application Data

[63] Continuation of Ser. No. 241,215, Mar. 6, 1981, abandoned.

[30] Foreign Application Priority Data

Mar. 21, 1980 [JP] Japan ................................. 55-35871

[51] Int. Cl.$^4$ .......................... G03C 5/00; G03C 5/24
[52] U.S. Cl. ..................................... 430/331; 430/285; 430/28 C; 430/302; 430/309
[58] Field of Search .............. 430/331, 309, 285, 28 C, 430/302

[56] References Cited

U.S. PATENT DOCUMENTS 3,669,668 6/1972 Watkinson et al. ................. 430/277
3,791,828 2/1974 Moore et al. ....................... 430/331
3,929,489 12/1975 Arcesi et al. ....................... 430/331
4,139,390 2/1979 Rauner et al. ...................... 430/285
4,186,006 1/1980 Kobayashi et al. ................. 430/309
4,258,124 3/1981 Shimizu et al. .................... 430/285
4,271,201 6/1981 Shimizu et al. .................... 430/309
4,271,251 6/1981 Aotani et al. ...................... 430/285

Primary Examiner—Charles L. Bowers, Jr.
Attorney, Agent, or Firm—Oblon, Spivak, McClelland, Maier & Neustadt

[57] ABSTRACT

A developer composition for a lithographic printing plate provided with a coated layer composed of a photosensitive polymer having in the main chain thereof groups of formula (I)

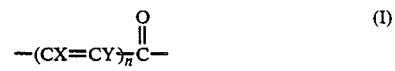

(I)

wherein X and Y independently represent hydrogen, halogen, cyano or nitro and n is an integer of 1 or 2, comprising:
(A) benzyl alcohol,
(B) tetrahydrofurfuryl alcohol and
(C) at least one acid selected from the group consisting of a mineral acid, an organic carboxylic acid and an organic sulfonic acid.

10 Claims, No Drawings

DEVELOPER COMPOSITION FOR LITHOGRAPHIC PRINTING PLATES

This is a continuation of application Ser. No. 241,215, filed Mar. 6, 1981, now abandoned.

BACKGROUND OF THE INVENTION

1. The present invention relates to a developer composition for lithographic printing plates.

2. Description of the Prior Art

Photo-crosslinkable, photosensitive polymer compositions have already been put widely into practical use as resists for photo-etching. This type of photosensitive polymers and polymer compositions are superior in various properties such as sensitivity, storage stability, image strength, sensitizing ability and the like, compared with diazo photosensitive materials which had previously been put into practice as lithographic printing plates and the like. For this reason, the photo-crosslinkable photosensitive polymers have widely used in lithographic printing plates in recent years. When these photosensitive polymers are exposed to actinic radiation, they are crosslinked and hardened so that the exposed polymer is relatively insoluble as compared with the unexposed polymer. Such difference in properties between the exposed area and unexposed area can be utilized to make printing plates photographically. For the purpose a lithographic printing plate base is coated with a photosensitive polymer along with other additives, for example, sensitizer and/or coloring agent to form a coated layer and the coated plate is then exposed imagewise to radiation to form soluble and insoluble areas. The unhardened soluble polymer in the unexposed area is then removed for the purpose of development, for example, by treating the plate with a developer solvent or solution capable of dissolving the unexposed polymer. The developer solution which remains on the surface of the plate and which contains the unexposed, unhardened soluble polymer is removed from the surface of the plate by rinsing the plate with water or treating it with an aqueous desensitizer whereby the plate is cleaned. Thus, the plate has an image formed thereon by a hydrophilic area not receiving printing ink and a lipophilic area receiving printing ink and it is used in printing operation.

Various developer solutions including developer compositions comprising γ-butyrolactone and an acid are known in the art. However, the prior art developer solutions are not always satisfactory with respect to lifetime in repeated use, stability of developing effect to variation in developing conditions such as developing time, storage stability and the like, although they can well develop a lithographic printing plate as long as they are fresh. In addition, if the developer solution used has a poor affinity to water, water rinsing or treatment with an aqueous desensitizer subsequent to development cannot afford efficient removal of the remaining developer solution from the surface of the plate, which may result in scumming or image unevenness. Moreover, if the viscosity of the developer solution is too high, particularly in mechanical development by means of an automatic developing machine, the rate of developer solution fed through the spray nozzles is decreased due to decreased circulation efficiency of the developer solution. As a result, the developer solution is not sufficiently supplied throughout the lithographic printing plate, which may cause an uneven development. More specifically, the mechanical developing process of lithographic printing plates is generally performed by feeding a processing solution such as a developer solution onto the surface of the lithographic printing plate through spray nozzles which are arranged in the direction perpendicular to the conveying direction of the plate and which are composed of small openings having a diameter not exceeding several millimeters. Therefore, if the viscosity of the developing solution is too high, it is difficult to spray the solution efficiently through the spray nozzles and the developer solution cannot be fed in a uniform rate onto the surface of the printing plate. In a conventional mechanical developing process, the developer solution is usually passed through a filter which is provided in the course of the circulation line of the developing solution in order to entrap the polymer removed from the plate. In such filtration, if the viscosity of the developer solution is too high, the flow rate of the developer solution is so decreased that it cannot be supplied sufficiently, resulting in an uneven development.

Therefore, there is a continuing need for providing a developer composition for lithographic printing plates having a coated layer of a photosensitive polymer, said composition being free from the above-mentioned disadvantages of the prior art developer solutions.

SUMMARY OF THE INVENTION

Thus, it an object of the present invention to provide a novel developer composition for lithographic printing plate having a colored coated layer of a photosensitive polymer, said composition having a low viscosity so that it is superior in liquid circulation efficiency and is readily used in a mechanical developing process, for example, by means of an automatic developing machine.

It is another object of the invention to provide a developer composition having a developing effect stable to variation in developing conditions, a low rate of fatigue during circulatory reuse and an excellent storage stability, said composition enabling one to perform a stable development over a prolonged period of time.

It is a further object of the invention to provide a developer solution for lithographic printing plates having a coated layer of a photosensitive polymer, said composition being capable of developing not only freshly made plates but also aged ones without unevenness in development, contamination and scumming.

A still further object of the invention is to provide a developer composition which is readily and efficiently removed from the surface of a printing plate during water rinsing or treatment with an aqueous desensitizer subsequent to development.

These and other objects can be accomplished by a developer composition for a lithographic printing plate provided with a coated layer composed of a photosensitive polymer having in the main chain thereof groups of formula (I)

wherein X and Y independently represent hydrogen, halogen, cyano or nitro and n is an integer of 1 or 2, comprising:

(A) benzyl alcohol,
(B) tetrahydrofurfuryl alcohol and (C) at least one acid selected from the group consisting of a mineral acid, an organic carboxylic and an organic sulfonic acid.

DETAILED DESCRIPTION OF THE PREFERRED EMBODIMENT

Further details of the present invention will be given in the following description.

A first ingredient of the developer composition according to the invention is benzyl alcohol. In general, the solvents which can be used in developer compositions are preferably low volatile solvents, usually having a boiling point of at least 150° C., from the viewpoint of workability and safety. Among the solvents having such property, benzyl alcohol is preferred because of its low viscosity and extremely high solvency power for photosensitive polymer compositions in unexposed areas wherein the photosensitive polymer has groups of the foregoing formula (I). Benzyl alcohol is present in the range of 5 to 90%, preferably 30 to 70% by weight based on the weight of the developer composition.

A second ingredient of the developer composition is tetrahydrofurfuryl alcohol. This alcohol has a low viscosity and a relatively high solvency power for the above-mentioned unexposed photosensitive polymer compositions. In addition it does not cause the hardened polymer in the exposed area to swell, thereby preventing the image from staining due to leaching of the pigment out of the exposed, insolubilized area.

The developer composition of the present invention is efficiently removed from the surface of a printing plate in the step of water rinsing or treatment with an aqueous desensitizer subsequent to development. This is because of the presence of tetrahydrofurfuryl alcohol which has a good affinity for water, too. The content of tetrahydrofurfuryl alcohol is in the range of 5 to 90%, preferably 10 to 40% by weight based on the weight of the developer composition.

In order to adjust the composition to a solvency power desired for its purpose or usage, the above-mentioned benzyl alcohol and tetrahydrofurfuryl alcohol may be combined, as required, with at least one good solvent and at least one poor solvent for the photosensitive polymer compositions in the unexposed area. In this manner, the solvency power of the developer composition can be adjusted to such a level that it has a good solvency action for the photosensitive polymer composition in the unexposed area, Thereby maintaining a high development efficiency over a prolonged period of time, but that the solvency power is not enough to cause the photosensitive polymer composition in the exposed area to be substantially swollen and damaged.

Since tetrahydrofurfuryl alcohol is able to mix a good solvent with a poor solvent or water sufficiently, it can easily balance the various efficiencies of the developer solution to a broader extent and make it possible to remove the developer solution from the surface of the printing plate in the step of water rinsing or treatment with an aqueous desensitizer.

Specific examples of the good solvent include ethylene glycol monophenyl ether, α-methylbenzyl alcohol, ethylene glycol monobenzyl ether, and the like.

Specific examples of the poor solvent include diethylene glycol monoalkyl ethers such as diethylene glycol monomethyl ether, diethylene glycol monoethyl ether, diethylene glycol monobutyl ether, etc; triethylene glycol monoalkyl ethers such as triethylene glycol monomethyl ether, triethylene glycol monoethyl ether, etc.; diethylene glycol monoalkyl ether acetates such as diethylene glycol monomethyl ether acetate, diethylene glycol monoethyl ether acetate, diethylene glycol monobutyl ether acetate, etc.; triethylene glycol monoalkyl ether acetates such as triethylene glycol monomethyl ether acetate, triethylene glycol monoethyl ether acetate, etc.; ethylene glycol monoalkyl ether acetates such as ethylene glycol monomethyl ether acetate, ethylene glycol monoethyl ether acetate, ethylene glycol monobutyl ether acetate, etc.; ethylene glycol monoalkyl ethers such as ethylene glycol monopropyl ether, ethylene glycol monoisopropyl ether, etc.; and the like.

These solvents are present in the range of 20 to 80% by weight of the developer composition.

In addition to these solvents, water may be used in an amount of 0.1 to 25%, preferably about 1 to 15% by weight of the developer composition in order to control the solvency power of the composition. Alternatively, water may be added with the acid ingredient mentioned below.

A third ingredient of the developer composition is at least one acid selected from the group consisting of mineral acids such as phosphoric acid, hydrochloric acid, sulfuric acid, etc.; organic carboxylic acids such as acetic acid, lactic acid, glycolic acid, α-pentenoic acid, etc.; and organic sulfonic acids such as benzenesulfonic acid, p-toluenesulfonic acid, etc. The content of such acid is 0.1 to 15% by weight of the developer composition. Preferred acid is a mineral acid, particularly phosphoric acid. These acids should be used in such amounts that the developer composition is adjusted to an acidic pH, preferably to about pH 1 to 6.

These acid ingredients also serve as poor solvents to control the solvency power of the developer solution, and they are particularly effective for the prevention of scumming or staining in the non-image areas of lithographic printing plates.

The developer compositions of the present invention which comprises the above-mentioned first, second and third ingredients have low viscosities, usually in the range of 6 to 7 cm$^2$/sec in kinematic viscosity, so that they are excellent in liquid circulation efficiency, spraying efficiency and spreadability (wetting power) on lithographic printing plates and can be used advantageously in mechanical developing processes, for example, using an automatic developing machine.

In a preferred embodiment, the developer compositions contain, in addition to the above-mentioned ingredients, one or more wetting agents or surfactants according to a conventional manner in order to impart such properties that allow the developer solution supplied onto a lithographic printing plate to spread out on the surface of the plate as well as such properties that does not allow separation of the pigment from the photosensitive polymer composition removed from the non-image area. These wetting agents or surfactants include, for example, polyhydric alcohols such as glycerol, diethylene glycol, etc.; phosphoric esters of alkanols such as n-hexanol, n-decanol, etc.; polyethers such as polyoxyethylene octylphenyl ether, polyoxyethylene oleyl ether, etc.; organic acid esters such as sodium dialkyl sulfosuccinate, etc. and the like.

In order to improve the tendency of ink to deposit on the exposed and hardened image areas of lithographic printing plates, it is more preferred that one or more oleophilic improvers such as methyl abietate, ethyl abietate, etc. be present according to a conventional manner.

In another more preferred embodiment the developer compositions contain, in addition to the above-mentioned ingredients, a small amount of an auxiliary agent which aids in effective removal of the photosensitive polymer compositions from the non-image area, thereby preventing staining and scumming in the non-image area or which prevents the polymer composition in the image area from swelling. Examples of such auxiliary agent are basic amines such as triethanolamine and salts of basic amines such as phosphoric acid salt of triethanolamine.

The developer compositions of the present invention are effective for the development of lithographic printing plates with a coated layer of a photosensitive polymer which has groups of the above formula (I) in the main chain of the polymer, for example, polyester, polycarbonate, polysulfonate or the like. Representative of such photosensitive polymers are polyesters and these polyesters can be readily prepared by condensation polymerization of a polycarboxylic acid capable of forming the group of the above formula (I) or its ester-forming derivative and a polyhydric alcohol in a conventional way. Examples of such polycarboxylic acid include p-phenylenediacrylic acid, p-carboxycinnamic acid, bis(p-carboxybenzal)cyclohexanone, bis(p-carboxybenzal)cyclopentanone, bis(p-carboxycinnamoyl)benzene, p,p'-chalconedicarboxylic acid, fumaric acid, maleic acid and the like. Of these p-phenylenediacrylic acid is particularly preferred. Other polycarboxylic acids such as succinic acid, adipinic acid, terephthalic acid, etc. may also be used along with the above polycarboxylic acids. Examples of polyhydric alcohol include ethylene glycol, diethylene glycol, triethylene glycol, tetraethylene glycol, propylene glycol, dipropylene glycol, tripropylene glycol, 1,3-propanediol, hydrogenated bisphenol A, hydrogenated bisphenol F, bis(62-hydroxyethoxy)cyclohexane, p,p'-dihydroxychalcone and the like. These alcohols may be used singly or as a combination of two or more members.

Lithographic printing plates are prepared generally by coating a base with the above-mentioned photosensitive polymer together with other additives, for example, a sensitizer and a coloring agent such as a copper phthalocyanine pigment in a conventional manner to form a coated layer. The use of a copper phthalocyanine pigment affords a lithographic printing plate having a colored coated layer.

The materials suitable for use as a printing plate base include sheets of such metals as aluminum, mechanically or electrochemically or chemically surface treated aluminum, copper, zinc, etc., paper, polymer-coated paper, synthetic resins and the like.

The development with the developer composition of the present invention can be performed in a conventional manner, for example, by supplying the developer solution onto the surface of an imagewise exposed lithographic printing plate to remove the unexposed polymer composition from the surface of the base. During this procedure, application of mild mechanical action such as wiping of the plate surface is effective for removal of the polymer composition from the non-image area.

Following the developing procedure, the lithographic printing plate is subjected to water rinsing or treatment with an aqueous desensitizer in order to remove the developer solution remaining on the plate surface.

Examples of the aqueous desensitizer include, for example, aqueous solutions which contain 5 to 30% by weight of a water-soluble natural polymer such as gum arabic, gum mesquite, dextrine, sodium alginate or carboxylcellulose; a water-soluble synthetic polymer such as polyvinyl alcohol, polyvinylpyrrolidone, polyacrylic acid or maleic anhydridevinyl ether copolymer; or the like. A surface active agent and/or an acid ingredient such as phosphoric acid may be used, as required, in combination with the above-mentioned water-soluble polymer.

In this way a lithographic printing plate can be made efficiently which is free from scumming or unevenness in image.

Having generally described the invention, a further understanding can be obtained by reference to a certain specific examples which are provided herein for purpose of illustration only and are not intended to be limiting unless otherwise specified.

EXAMPLE 1

To 4 wt. % solution of a photosensitive polyester in cyclohexanone were added 10% by weight of 1,8-dimethoxyanthraquinone and 15% by weight of a phthalocyanine pigment (both percentages being based on the weight of the polyester) to give a photosensitive solution. The polyester was prepared by condensation of 1.0 mole of p-phenylenediacrylic acid, 0.35 mole of hydrogenated bisphenol A and 0.65 mole of triethylene glycol. The photosensitive solution was applied to an electrolytically surface treated aluminum sheet to a thickness of 1.0 to 1.2 microns. The lithographic printing plate thus obtained was dried and then exposed for 20 seconds through a negative film to a 1 KW metal halide lamp which was placed at a distance of 65 cm. A developer solution having the composition indicated below was poured onto the printing plate and the surface of the plate was softly wiped with a cotton pad which was impregnated with the same developer solution. The resulting printing plate thus developed had a good image thereon and gave good impressions.

|  | wt. % |
| --- | --- |
| Benzyl alcohol | 57.7 |
| Tetrahydrofurfuryl alcohol | 19.2 |
| 85% Phosphoric acid | 9.6 |
| Water | 13.5 |

The values of kinematic viscosity of the developer solution at 30° C. are reported in Table 1 given below.

TABLE 1

|  | Processed Area | |
| --- | --- | --- |
|  | 0 m$^2$ | 300 m$^2$ |
| Kinematic viscosity (cm$^2$/sec.) | 6.2 | 7.3 |

EXAMPLE 2

A developer composition as described in Example 1 was placed into an automatic developimg machine equipped with a developer feed mechanism which comprises a developer circulating pump having a flow rate capacity of 30 l/min. and three 86 cm long spray pipes connected in parallel to the pump through 160 mesh cylindrical filters, each spray pipe having spray nozzles of 3 mm diameter at distances of 30 mm. Using this machine, a lithographic printing plate as described in Example 1, which had been imagewise exposed was developed.

The developer solution was satisfactorily supplied through the spray nozzles and spread out sufficiently throughout the surface of the plate. Even at a conveying rate of 2.5 m/min., a satisfactory development was achieved without uneven development. When the developed printing plate was mounted on a press to perform a printing test, scumming-free good impressions were obtained.

EXAMPLE 3

A lithographic printing plate as described in Example 1 was exposed in the same way as in Example 1 and developed with the automatic developing machine described in Example 2 which had been charged with 20 l of a developer composition as described in Example 1. The imagewise exposed and developed lithographic printing plate was then visually observed with respect to the state of removal of the coated layer in the unexposed area and the state of development in the area of a step wedge which was incorporated in the negative film and which had stepwise increasing transmission densities. The results are shown in Table 2, from which it can be seen that the developer composition had a prolonged lifetime in repeated use and a stable developing power.

TABLE 2

| | Processed area | | |
|---|---|---|---|
| | 0 m² | 100 m² | 300 m² |
| Removability of non-image area (Developing properties) | Good | Good | Good |
| Step image  Number of solid steps | 5 | 5 | 5 |
| Step image  Number of clear steps | 10 | 10 | 10 |

EXAMPLE 4

The developer composition as described in Example 1 was analyzed gas-chromatographically after it was aged at 55° C. for a week. The spectrum was identical to that obtained immediately after its preparation. Thus, no change in composition due to aging could not be appreciated and it was found that the developer composition had a good storage stability.

EXAMPLE 5

A lithographic printing plate as described in Example 1 was subjected to forced aging at a temperature of 55° C. and a relative humidity of 20% for a week prior to exposure and development and then exposed in the same way as in Example 1. The development of the plate was then carried out using the automatic developing machine as described in Example 2 which was charged with the developer solution as described in Example 1 which had been used to develop lithographic printing plates of 300 m² in total areas. No staining or scum formation was noted in the unexposed area, nor elution or leaching of the pigment out of the image area was observed. When the printing plate was mounted on a press to perform a printing test, scum-free good impressions were obtained.

COMPARATIVE EXAMPLE 1

A lithographic printing plate as described in Example 1 was exposed in the same way as in Example 1 and developed with a developer solution having the following composition:

| | Weight % |
|---|---|
| Benzyl alcohol | 70 |
| 85% Phosphoric acid | 10 |
| Water | 20 |

As a result, during the treatment with an aqueous desensitizer which was conducted immediately after the development some disorder was observed in the image area, and a good image could not be obtained.

COMPARATIVE EXAMPLE 2

A lithographic printing plate as described in Example 1 was exposed in the same way as in Example 1 and developed with a developing solution having the following composition:

| | Weight % |
|---|---|
| Tetrahydrofurfuryl alcohol | 70 |
| 85% Phosphoric acid | 10 |
| Water | 20 |

As a result, the coated layer in the unexposed area was not sufficiently removed to obtain a good image.

Having now fully described this invention, it will be apparent to one of ordinary skill in the art that many changes and modifications can be made thereto without departing form the spirit or scope of the invention as set forth herein.

What is claimed as new and intended to be covered by Letters Patent is:

1. A method of developing an image in a light exposed photosensitive coating of a lithographic printing plate, said coating consisting of a photosensitive polyester prepared by polycondensing at least one polycarboxylic acid or ester thereof containing within its structure at least one radical of the formula:

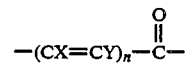

wherein X and Y independently represent hydrogen, halogen, cyano or nitro, and n is an integer of 1 to 2, with at least one polyhydric alcohol, consisting of:
  washing the unexposed portions of said exposed photosensitive coating from said plate with a developer solution consisting of: (a) from 5–90 wt.% benzyl alcohol, (b) from 5–90 wt.% tetrahydrofurfuryl alcohol, (c) from 0.1–15 wt.% of at least one acid selected from the group consisting of a mineral acid, an organic carboxylic acid and an organic sulfonic acid and (d) from 0.1 to 25% by weight water.

2. The method of claim 1, wherein said polycarboxylic acid is p-phenylenediacrylic acid, p-carboxycinnamic acid, bis-(p-carboxybenzal)cyclohexanone, bis(p-carboxybenzal)cyclopentanone, bis(p-carboxycinnamoyl)benzene, p,p'-chalconedicarboxylic acid, fumaric acid, maleic acid, succinic acid, adipic acid or terephthalic acid.

3. The method of claim 1, wherein said polyhydric alcohol is ethylene glycol, diethylene glycol, triethylene glycol, tetraethylene glycol, propylene glycol, dipropylene glycol, tripropylene glycol, 1,3-propanediol, hydrogenated bisphenol A, hydrogenated bisphenol F, bis(β-hydroxyethoxy)cyclohexane or p,p'-dihydroxychalcone.

4. The method of claim 1, wherein said acid (c) is a mineral acid.

5. The method of claim 4, wherein said mineral acid is phosphoric acid.

6. The method of claim 1, wherein the content of tetrahydrofurfuryl alcohol in the developer ranges from 10 to 40% by weight.

7. The method of claim 1, wherein the content of benzyl alcohol in the developer ranges from 30 to 70%.

8. The method of claim 1, wherein said acid component (C) is benzene sulfonic acid or p-toluene sulfonic acid.

9. The method of claim 1, wherein said acid component (C) is acetic acid, lactic acid, glycolic acid, or α-pentenoic acid.

10. The method of claim 1, wherein the developer solution has a pH of 1–6.

* * * * *